June 2, 1970 P. K. DANO 3,516,085

ANALOG TO DIGITAL CONVERSION SYSTEM

Original Filed Oct. 18, 1965 2 Sheets-Sheet 1

INVENTOR:
PAUL K. DANO
BY: N. N. Kunitz
HIS ATTORNEY

June 2, 1970 P. K. DANO 3,516,085

ANALOG TO DIGITAL CONVERSION SYSTEM

Original Filed Oct. 18, 1965 2 Sheets-Sheet 2

INVENTOR:
PAUL K. DANO
BY: [signature]
HIS ATTORNEY

United States Patent Office 3,516,085

Patented June 2, 1970

3,516,085

ANALOG TO DIGITAL CONVERSION SYSTEM

Paul K. Dano, Dona Ana County, N. Mex., assignor, by mesne assignments, to Globe Universal Sciences, Inc., a corporation of Texas Continuation of application Ser. No. 496,799, Oct. 18, 1965. This application May 15, 1969, Ser. No. 833,838
Int. Cl. H03k 13/02
U.S. Cl. 340—347 10 Claims

ABSTRACT OF THE DISCLOSURE

An apparatus for extending the dynamic range of an analog to digital converter wherein a fixed gain amplifier is placed in the input circuit of the converter and the input voltage of the amplifier is changed to maintain its output voltage within the dynamic range of the converter. A digital signal representing the value of the change in the input voltage is combined with the digital signal from the converter to form a single digital data word.

This is a continuation of application Ser. No. 496,799 filed Oct. 18, 1965, and now abandoned.

This invention relates generally to the conversion of analog voltage signals into digital signals representative of the amplitude of the analog voltage. More particularly this invention relates to an apparatus for use with a conventional analog to digital converter whereby the dynamic range of the analog to digital conversion may be extended.

The use of analog to digital converters to produce multi-digit numbers, such as binary numbers, representing the instantaneous value of an input analog voltage has long been known in the art. In such systems, the analog signal having an amplitude within the input voltage range of the converter is fed to the input of the converter and is converted to a number of output digits within the dynamic range of the analog to digital converter. By dynamic range it is meant the maximum possible number of digits in the output signal from the converter. Once the converter has been built, therefore, the dynamic range of the converter is fixed and normally cannot be extended short of reconstructing the converter. In the present state of the analog to digital converter art, the dynamic range of analog to binary digital converters is normally limited to 14 bits plus sign in order that the converter have a sufficiently short read or conversion time to allow the sampling frequency of the converter to be high enough to insure that the converter output follows the changes in the analog signal input with a reasonable degree of accuracy. Although the analog to digital converters currently available are sufficiently accurate and have a dynamic range which is satisfactory for most purposes, often situations arise where it would be advantageous to be able to extend the dynamic range of a converter. Such a situation arises where it is necessary to accurately read very small signals in the presence of very large signals, e.g. where the ratio between the amplitudes of largest and smallest signals may be in the order of a million to one. Since as indicated above the dynamic range of a given analog to digital converter is fixed, efforts in the past to provide methods of reading such small signals under the conditions mentioned have been directed to increasing the amplitude of the small signals, for example, by means of a variable gain amplifier, to a readable range before they are fed to the converter, and then recording an analog or digital signal representative of the gain along with the recorded digital signal. In order to determine the value of the original signal, the digitized signal and the analog signal must be converted to a common format and multiplied. However, in addition to the problems encountered with such systems in accurately and rapidly varying the gain to the desired value, such systems can provide an improvement only where the very small signals are interleafed or between the larger signals, and consequently the small signals can be individually amplified to a value where they can be accurately read by the converter. Where the small signals are riding on or superimposed on the larger signals, however, substantially no improvement is presented. This is because when adjusting the gain of the system to accommodate the large signal level, the smaller superimposed signals are still too small to be detected and digitized accurately within the resolution of the converter. That is to say, the effective voltage range of the least significant digit of the analog to digital converter has not been changed for the larger signals, and hence small variations of the voltage level of the larger signal resulting from signals riding thereon are still within the same least significant digits and cannot be any more accurately detected than before the gain change.

The system according to the present invention makes no use of variable gain control but provides a relatively simple apparatus having a constant gain which is used in combination with the converter to effectively extend the dynamic range of the converter. That is, the additional apparatus continuously operates on the analog signal, prior to feeding it to the converter, and provides a number of additional digital bits corresponding to the most significant digits of the analog to digital conversion word. In this way the resolution, and hence the readability of the converter, is improved and small changes in the amplitude of the analog input signal even when they are riding on relatively large signals can be more accurately detected since the least significant digits of the digital converter now represent smaller voltage ranges. Additionally the system according to the invention provides for the detection of low level signals with increased resolution as in the variable gain type of system but because the gain of the system is constant does not require the continuous recording of a second signal with which the digitized word must be multiplied.

Briefly, the system according to the invention extends the dynamic range of the analog to digital converter by continuously detecting the magnitude of the input voltage to the converter; chopping or offsetting the input voltage, i.e., changing the D.C. level thereof, by a fixed known quantity each time the magnitude of input voltage exceeds a predetermined value in order to maintain the input voltage within the input voltage range of the analog to digital converter; and then combining a digital signal representing the value of the offset voltage with the digital output signal from the converter to form a single digital data word. With this arrangement, the additional digital signals corresponding to the total value of the offset voltage used represent the most significant digits of the digital data word and thereby the effective dynamic range of the converter has been extended by the number of the additional digital signals which can be provided by the digital circuit indicating the value of the offset.

Actually the apparatus, according to the preferred embodiment of the invention, entails the placing of an operational amplifier having a fixed gain between the source of analog input signal and the input of the converter. The gain of the amplifier is adjusted to a value in accordance with the particular requirements and parameters of the system. For example, if it is desired to use the increased dynamic range merely to enable the analog to digital converter to digitize analog signals having a voltage range larger than that of the converter, then an amplifier with unity gain may be used. However, in the preferred embodiment of the invention where it is desired to increase the dynamic range of the converter for the purpose of more accurately detecting and digitizing small signals within the normal input voltage range of the converter, the amplifier has a gain other than unity. The output signal from the amplifier is continuously monitored by a threshold device which produces a distinctive output signal each time the monitored signal exceeds a predetermined value which preferably is equal to or slightly less than the maximum permissible signal to the converter. The output signals from the threshold device are counted in a digital counter which controls the chopping or offsetting of the input analog signal to the system in fixed digital steps and in a manner whereby the count in the counter indicates the value of the offset. Preferably the change in the magnitude of the output signal from the amplifier caused by each of said steps is equal to the magnitude of the maximum permissible input signal to the converter so that the digital representation of the amount of offset of the input signal may be directly combined with the output of the analog to digital converter to form a single digital data word with the digital output of the counter being the most significant digits of the data word.

The invention and the advantages thereof will be more clearly understood from the following detailed description taken in conjunction with the accompanying drawings wherein.

Figure 1:
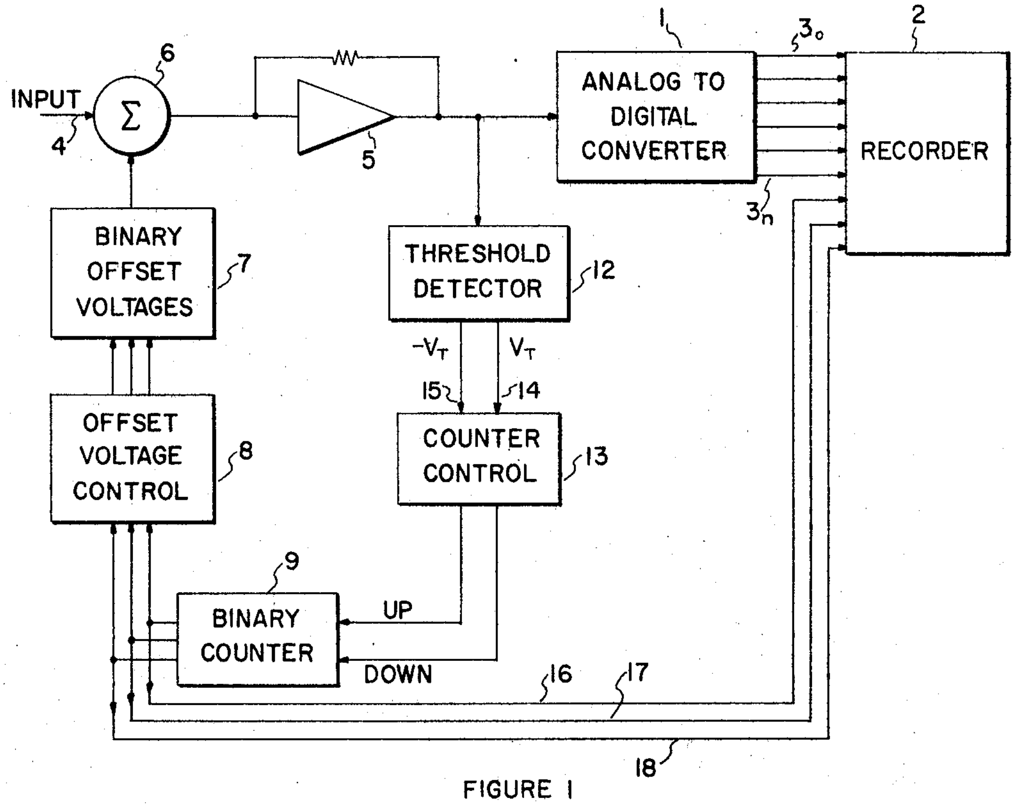
FIG. 1 is a block diagram illustrating broadly the system according to the invention.

Referring now to FIG. 1 there is shown an analog to digital converter 1 of any type which is capable of converting an analog input signal to a multi-digit binary output signal. As is conventional in the art, the output signals from converter 1 representing the digital bits are fed in parallel to the input of a storage device, such as recorder 2 via a plurality of output lines $3_0$–$3_n$ equal to the number of bits in the binary output word from the converter. The analog input voltage which is to be digitized is fed to the system from a source of signal (not shown) via an input terminal 4. Connected between the input terminal 4 and the input of the converter 1 is a D.C. or operational amplifier 5 having a summing junction 6. The amplifier 5 has a fixed gain which is preadjusted to a value depending on the parameters of the system and the particular manner in which the dynamic range is to be extended. Connected to the summing junction 6 are a plurality of sources of D.C. offset voltage 7 which are adjusted in a binary progression and preferably are adjusted such that the magnitude of the offset voltage representing the least significant value in the binary progression changes the D.C. level of the input signal to the amplifier 5 an amount sufficient to cause the D.C. level of the output signal from the amplifier 5 to change by an amount equal to the magnitude of the maximum permissible input signal to the converter 1. For example if the input voltage range of the analog to digital converter is $\pm 10$ volts, then the magnitude of offset voltage representing the least significant digit in the binary progression should be sufficient to offset the analog input signal an amount sufficient to cause a 10 volt change in the output signal from the amplifier 5.

The particular value of the offset voltage applied to the input signal, or in other words, the number of binary weighted voltage sources 7 which are connected to summing junction 6, is controlled by means of an offset voltage control circuit 8, which consists essentially of a separate switching device for each of the offset voltages, and a binary counter 9 having at least as many stages as there are offset voltages in the above mentioned binary progression. Each stage of the binary counter 9 controls, via the appropriate switch in the control circuit 8, the connection or disconnection of the correspondingly valued binary weighted offset voltage to the summing junction 6 and hence the indicated count of the binary counter 9 at any instant of time is representative of the binary value of the offset voltage applied to the analog input signal appearing at terminal 4. In addition to the outputs from the counter 9 indicating the count therein, an additional output from the counter is preferably provided which indicates the polarity of the offset voltage being applied whereby the system can be used with bipolar as well as unipolar input signals i.e., with A.C. as well as D.C. analog input signals.

In order to control the count in counter 9 and hence the amount of offset voltage applied to the input signal at terminal 4, a threshold detector 12 and a counter control circuit 13 are provided. The threshold detector 12 is connected to the output of amplifier 5, and continuously monitors the output signal of amplifier 5 to produce an output signal, i.e., a pulse, each time the magnitude of the output voltage signal from amplifier 5 exceeds a predetermined threshold value $|V_T|$. The threshold voltage $|V_T|$ is chosen such that it is within the input voltage range of the converter 1, i.e. below the magnitude of the maximum permissible input signal to the converter, and below the value of the maximum possible output signal from the amplifier 5, i.e. the saturation value. Each time that the output signal from the amplifier 5 exceeds the threshold value and depending on whether the negative or the positive threshold value has been exceeded, the threshold detector 12 produces an output signal, either on output line 14 or output line 15 which causes the counter control circuit 13 to change the count in the binary counter 9 by one binary count, either in an upward or downward direction and thereby changes the value of the offset voltage applied to the input signal to maintain the output signal from amplifier 5 within the voltage input range of converter 1. Since as indicated above, the change in offset voltage applied to the input signal between successive steps or binary counts causes a change in the output signal from amplifier 5 equal to the magnitude of the maximum permissible input signal to the converter 1, the count in the binary counter 9 continuously represents the most significant digits of a binary digital data word representing the instantaneous amplitude of the analog input signal, i.e., the converter 1 sees a portion of the voltage within the least significant digit of the binary counter 9. Accordingly the dynamic range of the converter 1 has effectively been extended by the number of digits at outputs from the counter 9. In order therefore to record the entire binary digital word representing the amplitude of the analog input signal at terminal 4, the outputs of counter 9 are connected by leads 16–18 to separate inputs of recorder 2 where they are recorded in synchronism with digits from converter 1 representing the particular sampled analog value.

Figure 2:
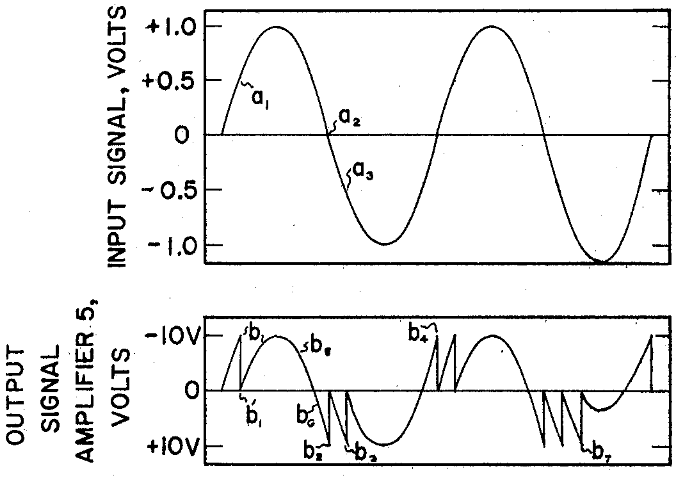
FIG. 2 is a pair of curves indicating an analog input signal to the system and the same signal as it appears at the output of the operational amplifier after being offset in fixed steps by the apparatus according to the invention.

The manner in which the input signal is chopped or offset and a count indicating the offset is retained is shown in FIG. 2 wherein the upper curve *a* represents the analog input signal and the lower curve *b* represents the output signal from amplifier 5. For purposes of the example it is assumed that the amplifier 5 has a gain of twenty, the threshold value is ten volts and the output voltage from amplifier 5 is chopped in ten volt steps. As shown in FIG. 2, when the input signal reaches 0.5 volt ($a_1$), the output of amplifier 5 exceeds a negative threshold value ($b_1$), whereby the threshold detector 12 produces an output on lines 15 causing the counter 9 to increase its count by one binary digit and energize the voltage control circuit 8 to connect the first offset voltage in the binary series to the input 4 to offset the input voltage by an amount which produces a ten volt drop in the output from the amplifier 5 ($b'_1$) i.e., the D.C. level of both the input signal and the output signal from amplifier 1 is effectively changed. The output voltage $b$ then continues to follow the analog input signal until such time as the positive threshold $V_T$ is exceeded as indicated at $b_2$. This occurs in the illustrated example when input signal has reached a zero value as indicated at $a_2$. At this time the threshold detector 12 produces an output signal on the line 14, thus causing the counter 9 to change its count by one in the direction opposite from the previous instance and thereby return its count to zero. Additionally the counter 9 causes the voltage control circuit to move the offset voltage previously applied in response to the first detected threshold signal. At this point no offset of the input signal is taking place. As the input signal $a$ continues to increase in a negative direction, a second threshold value $b_3$ is reached when the signal $a$ exceeds −0.5 volt ($a_3$). This again causes the threshold detector 12 to produce an output signal on the line 14 causing the binary counter to register a count of one and also to change its sign bit so that the indicated count is minus one and the input signal is chopped by the addition of a negative polarity offset voltage. The output signal then continues to follow the input signal at terminal 4 until the next threshold value is exceeded ($b_4$) at which time the above outlined process is repeated. With this arrangement, as indicated above, the count in the binary counter 9 represents the most significant digits of the output of the converter 1, and the signals representing the digits of the count in counter 9 need only be combined or added to the output signals from converter 1 to form the single binary digital data word. For example, if the converter 1 samples the signal $b$ at a point $b_5$, the converter will produce an output signal indicating, in digital form, an input signal thereto of approximately −5 volts. However, the output signal from the binary counter 9 indicates a count of minus one and since this digit represents maximum or full range of the converter the additional digit may be directly added to the digital output word as the most significant digit thereof, thus producing a digital word representing −15 volts, the true value of the output signal from amplifier 5. It should be noted that should the converter 1 sample the output signal from amplifier 5 at a time when the indicated polarities of the output signals from counter 9 and converter 1 are different, e.g., at point $b_6$, then directly placing the output digits from counter 9 in front of the output digits from converter 1 will not suffice. In such a case the signals must be combined, as is well known in the digital art, by binary addition of the signals to secure the difference therebetween. It should also be noted that although the system has been illustrated showing only two successive chops or offset steps in any sequence, it is understood that the system is not so limited, for example note point $b_7$ indicating three successive chops. Following this sequence of three chops or successive offsets the counter 9 has an indicated count of minus two indicating that the magnitude of the output signal from amplifier 5 is above 20 volts and that therefore the magnitude of the input signal at terminal 4 is above minus one volt.

Figure 3:
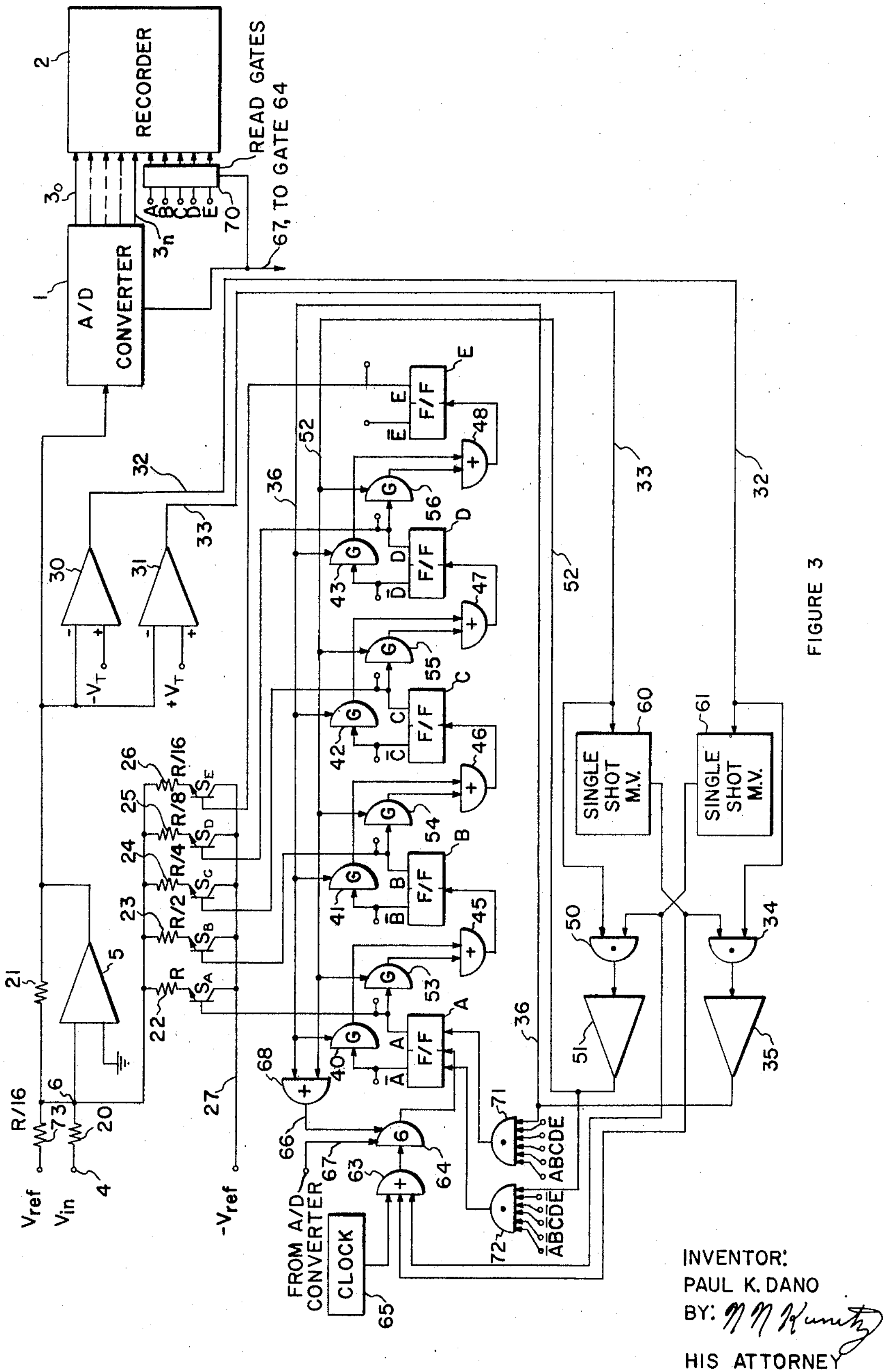
FIG. 3 is a detailed block diagram of a preferred embodiment of the apparatus according to the invention.

Referring now to FIG. 3, there is shown the preferred embodiment of the apparatus according to the invention. In this figure, blocks which represent the same subject matter as shown in FIG. 1 are referred to by the same reference number. As shown in FIG. 3, the analog input voltage ($V_{in}$) appearing at input terminal 4 is connected to the summing junction 6 of the amplifier 5 via an input resistance 20. The gain of the amplifier 5 is then adjusted to a fixed value by adjusting the ratio of the resistance 20 to that of the amplifier feed back resistance 21. Also connected to the summing junction 6 of the amplifier 5 is the common junction of a plurality of resistances 22–26 which are connected in a binary weighted summing network with the resistances having a value of R, $R/2$, $R/4$, $R/8$ and $R/16$ respectively. The other end of each of the resistances 22–26 is connected via one of a plurality of transistor switches $S_A$–$S_E$ respectively and a common line 27 to a source of D.C. reference potential which in the instant example is of negative polarity ($-V_{ref}$). The source of reference potential and the associated binary weighted resistances thus in effect provide for a plurality of binary weighted current sources when considered with respect to the amplifier input and thus provide for the offset of the input signal to the amplifier 5. As indicated above with respect to FIG. 1, resistance 22 is adjusted such that the current supplied to the input of amplifier 5 via this resistance will cause a change in the D.C. level of the output signal from amplifier 5 equal to the magnitude of the maximum permissible input signal to the analog to digital converter 1.

Each of the transistor switches $S_A$–$S_E$ has its base connected respectively to the output from one half of a plurality of flip-flops A–E which are interconnected to form a binary register or counter. As shown in the figure, the switches $S_A$–$S_E$ are connected to the output from the right hand section of the respective flip-flops A–E, and are responsive to a negative output signal from the right-hand side of the flip-flop, i.e., a count of one in the flip-flop to connect the voltage source $-V_{ref}$ via the respective resistor 22–26 to the summing junction 6.

In order to cause the counter formed by the flip-flops A–E to change its count in accordance with the amplitude of the output signals from the amplifier 5 in the manner described above with respect to FIG. 1, the output signal from the amplifier 5 is continuously monitored by a pair of comparators 30, 31 which, for example, may be difference amplifiers as indicated, or any other sort of circuit which produces an output whenever a predetermined precision threshold voltage is exceeded such as a Schmitt trigger. As indicated, the difference amplifier 30 produces a positive output signal on line 32 whenever the magnitude of the output voltage from amplifier 5 exceeds $-V_T$ and the difference amplifier 31 produces a positive output signal on line 33 whenever the magnitude of the output signal from amplifier 5 exceeds $V_T$. Any output signal on line 32 is fed via "and" circuit 34, non-inverting driver amplifier 35 and line 36 to one input of a plurality of gates 40–43. The gate 40 has the other input thereof capacitively connected to the output from the left hand or reset side of the flip-flop A, i.e., the $\bar{A}$ output terminal, and the output thereof connected via "or" circuit 45 to the common input of the flip-flop B. With these connections, whenever the flip-flop A is changed its reset or $\bar{A}$ condition, a negative output pulse is produced at the left-hand output from the flip-flop which if present at the same time that a positive signal is present on the line 36 will cause a negative input pulse to be delivered to the input of flip-flop B, thereby changing the state of flip-flop B. Similarly, the gates 41–43 are connected between the outputs from the left-hand sections of flip-flops B–D respectively and the common inputs of the flip-flop stage i.e., flip-flops C–E respectively, via the "or" circuits 46–48. As can easily be appreciated, any positive signal appearing on the line 36 in response to a signal from the comparator 30 will condition the gates 40–43, and hence the binary counter formed by the flip-flops A–E, so that the count represented by the outputs from the flip-flops increases by one binary count for each negative input pulse fed to the input of flip-flop representing the least significant digit in the binary counter, i.e., flip-flop A. In a similar manner any positive signal originating from the difference amplifier 31 indicating that a positive threshold has been exceeded will, via line 33 "and" circuit 50, non-inverting driver amplifier 51, line 52 and gates 53–56, condition the binary counter formed by the flip-flops A–E to decrease its binary count by one for each negative pulse fed to the input of flip-flop A.

As indicated above, any flip-flop conditioning signal appearing on lines 36 or 52 originates from a threshold signal appearing on line 32 or 33 respectively which must be passed through respective "and" circuits 34 and 50. In order to condition the circuits 34 and 50 so that they can pass the signals on lines 32 and 33 to the respective lines 36 and 52, the second input of the gates 34 and 50 are connected to the outputs of single shot multivibrators 60, 61 respectively. The inputs of multivibrators 60 and 61 are connected to lines 33 and 32 respectively. The output signals from multivibrators 60 and 61 are normally maintained at a positive value and consequently the "and" circuits 34 and 50 are normally conditioned to pass any output signals from amplifiers 30, 31 appearing on lines 32, 33 to the respective binary counter conditioning lines 36 and 52. However, on a positive signal indicating that a threshold value has been exceeded appears on line 32 or line 33, the correspondingly connected multivibrator 60, 61 is triggered, thereby causing a negative pulse to be produced at the output of the triggered multivibrator. This negative pulse in turn causes the "and" circuit 34 or 50 connected to the output of the triggered multivibrator to block the passage of counter command signals therethrough. The multivibrators 60, 61 "and" circuits 34, 50 therefore function to prevent an up and down count command signal from being simultaneously present on the lines 36 and 52. It should be noted that although theoretically such a situation should not occur in a practical application the switching of the flip-flops and hence the switching of the current switches $S_A$–$S_E$ takes a finite amount of time, improper D.C. level offsets may be present for small periods of time during the switching operation. This could cause the output signal from amplifier 5 to exceed the threshold value of the opposite polarity from that which initiated the switching and thus generate the second count command signal. The output signal from the initially triggered multivibrator however will prevent this from occurring removing the conditioning voltage from its respectively connected "and" circuit for a period of time sufficient to allow the switching of the flip-flops A–E to be completed.

The negative output pulses from the multivibrators 60 and 61 are also connected via and "or" circuit 63 and gate 64 to the common input of flip-flop A where they provide the normal input pulses which are counted by the binary counter formed by the flip-flops A–E. Also connected to the input of "or" circuit 63 is a clock 65 for producing a train of negative clock pulses the purpose of which will be more fully explained below. In order to condition for gate 64 to pass the output pulses from "or" circuit 63 to the flip-flop A the presence of a positive signal is required on both control input leads 66 and 67 to the gate 64. The gate control input line 66 is connected to the output of an "or" circuit 68 which produces a positive output signal only when a control signal is present on either of the counter control lines 36 or 52. Hence the "or" circuit 68 only conditions the gate 64 to pass the output pulses from "or" circuit 63 to the flip-flop A when one of the difference amplifiers is producing an output indicating that a threshold value has been exceeded, and prevents the state of the flip-flop A from being continually changed by the output pulses from the clock pulse generator 65.

The signal on the gate control input lead 67 is derived from the analog to digital converter 1 and is normally maintained at a positive value thus normally permitting the gate 64 to pass an input pulse to the flip-flop A each time the output signal from amplifier 5 exceeds a threshold value. However as indicated above, the circuit according to the invention continuously follows the variations in the amplitude of the analog input signal at terminal 4 and consequently the count represented by the outputs from the flip-flops A–E may be continuously changing. On the other hand, as is conventional in the art, the analog to digital converter 1 does not continuously follow the variations in the amplitude of the input signal thereto but rather samples the signal at discrete intervals of time. In order therefore that the binary digits represented by the outputs from the flip-flops A–E and the binary digits in the output from the converter 1 represent the amplitude of the analog input signal at terminal 4 at the same instant of time, the converter 1 produces an inhibit or negative pulse on the line 67 during the period of time that the converter 1 is sampling and digitizing the analog input signals thereto; thus the inhibit pulse causes gate 64 to block the passage of input pulses to the flip-flop A and prevents the flip-flops A–E from changing their states until the converter 1 has completed its digitizing operation. The negative inhibit pulse on line 67 is also used to condition a plurality of read gates indicated generally by reference numeral 70 to cause the output signals from the set outputs of the flip-flops A–E to be recorded in synchronism with the output signals from the converter 1. Obviously, if desired, the output signals from the reset outputs of the flip-flops may be recorded in place of the signals from the set outputs.

As mentioned above, if during the period of time that an inhibit pulse present on the line 67, a pulse was also generated by one of the multivibrators 60, 61 in response to a threshold value being exceeded, that the passage of the multivibrator pulse to the flip-flop A will be blocked by the gate 64. This will prevent the proper offset from being switched to the input of amplifier 5 and thus prevent the energized difference amplifier 30 or 31 from returning to its quiescent state. Since it is the change of state of the difference amplifiers, via the multivibrators which produces the stepping pulse for the binary counters, and since in the absence of the insertion of the proper offset voltage no change of state of the difference amplifier is possible and accordingly some provision must be made to artificially pulse flip-flop A in accordance with either the "up" or "down" command at the conclusion of the inhibit pulse. It should be noted that when the inhibit pulse is terminated, the particular difference amplifier which previously caused the multivibrator to produce an output pulse will still be producing an output signal level, and hence the counter conditioning gates 40–43 or 53–56, will still be conditioned but no input pulse to switch the multivibrators will be available. Accordingly when the inhibit pulse is terminated the output pulse from the clock 65 will be gated to the flip-flop A for the purpose of changing the count therein.

The logical circuitry for controlling count represented by the flip-flops A–E also includes an additional pair of "and" circuits 71 and 72 which have their outputs connected to the set (A) side and the reset ($\overline{A}$) side respectively of flip-flop A. The "and" circuit 71 is responsive to a set output signal from each of the flip-flops A–E and an output signal from driver amplifier 35 indicating that the count in the flip-flops is to be increased by one, to prevent the flip-flop A from changing its count in an upward direction. Since a set output from each of the flip-flops indicates that the counter is full, i.e. has reached its maximum count, the "and" circuit effectively functions to prevent the counter from switching from a maximum count to a zero count and thereby completely fouling the operation of the system. Similarly the "and" circuit 72 functions to prevent the count in binary counter from changing from a zero count to a maximum count in response to a single negative input pulse to flip-flop A by preventing the reset side of flip-flop A from switching whenever all of the flip-flops are in the reset state and the driver amplifier 51 produces an output signal indicating that a positive threshold value has been exceeded.

As mentioned above with respect to FIG. 1, the system according to the invention is responsive to A.C. as well as D.C. analog signal and must respond to signals of both negative and positive polarity. Accordingly the most significant digit of the binary output from the counter, i.e. the output from flip-flop E is used to indicate the polarity of the signal. In order that the flip-flop automatically respond to the polarity of the analog input signal $V_{in}$ without the addition of additional logical or detection circuitry, a source of reference voltage of a polarity opposite to that of the reference voltage connected to line 27 is connected via a resistance 73 to the summing junction 6 and the resistance 73 is adjusted so that the current flowing therethrough is equal in magnitude to the current flowing through resistance 26 when transistor $S_E$ is conducting. Preferably as indicated in the figure the reference source connected to the resistance 73 is equal in magnitude to the reference voltage applied to the line 27, but of opposite polarity and the resistance 73 is adjusted to the same value as resistance 26, i.e. $R/16$. With this arrangement, and with no input signal $V_{in}$ at terminal 4, the output signal from amplifier 5 produced by the current flowing through resistance 73 will cause the difference amplifier 31 to produce an output signal which conditioned the gates 40–43 and the clock pulses from clock 65 will cause the counter formed by the flip-flops A–E to continue to increase its count until only the flip-flop E is in the set state. Consequently, only the transistor $S_E$ is conducting and the sum of the currents of the summing junction 6 is equal to zero whereby the output from amplifier 5 is reduced to zero and the system is once more at rest. Any input signal at terminal 4 which is of a positive polarity will now merely cause the flip-flops A–D to change their state via output signals derived from comparator or difference amplifier 30 but will have no effect on the state of flip-flop E since switching the state of flip-flop E by an input signal of a positive polarity will be prevented by the "and" circuit 71 as explained above. Should the magnitude of $V_{in}$ change to a negative value and cause the output from amplifier 5 to exceed the positive threshold value $V_T$, the output signals from amplifier 31 will cause the counter formed by the flip-flops A–E to decrease its count thus switching the state of flip-flop E to its reset condition. It is noted that until a positive threshold value is reached the state of the flip-flop E will technically be indicating that the signal is of a positive polarity. However since the digital output of the flip-flops A–D is equal to zero, the state of the sign bit is of no consequence.

It is to be understood that although the system has been described for use with binary counters and analog to binary digital converters, that in fact the basic invention is applicable to other forms of digital equipment e.g. decimal converter. However, it should be noted that the offset switching networks for such a system would be rather complicated and accordingly a binary digital system is preferred.

It is also to be understood that although the system has been described whereby the threshold levels are equal to the change in D.C. level at the output of amplifier 5 and accordingly the output signal from amplifier 5 is always chopped to zero, that the system is not so limited. For example, using the same degree of change in D.C. level for each offset step, i.e. 10 volts, the threshold level may be set at 7 volts whereby the output signal would then be chopped or changed to −3 volts.

It is further understood that although the outputs of the flip-flops A–E and the converter 1 have been shown as being fed to a recorder 1, that other types of devices for memorizing or combining the output signals may be used. For example, the signals may be fed directly to a computer.

What is claimed is:

1. Apparatus for extending the dynamic range of an analog to digital converter comprising:

(a) an amplifier having a fixed gain, said amplifier having one input terminal for connection to a source of varying analog input signal and an output terminal for connection to the input of a converter;

(b) means including a counter continuously responsive to the output signal from said amplifier for changing the D.C. level of the input signal to said amplifier in fixed, binary-weighted steps to maintain the output signal from said amplifier within the input voltage range of the converter;

(c) means for generating an inhibit signal related to the time when the converter is engaged in digitizing a sample;

(d) means responsive to said inhibit signal for inhibiting the operation of said counter during the time said converter is engaged in digitizing a sample; and (e) means for recording said D.C. level in binary digital form in synchronism with the digital output of the converter to form a single digital data word, whereby the digital signal corresponding to the D.C. level represents the most significant digits of said data word.

2. The apparatus of claim 1 wherein said means responsive to the output signal from said amplifier comprises:

a plurality of D.C. voltage sources differing in magnitude from each other in a binary progression;

voltage responsive means connected to said output terminal of said amplifier for producing an output signal whenever the magnitude of the output signal from said amplifier exceeds a predetermined value; and means responsive to the output signals from said voltage responsive means for selectively combining the output signals from said voltage sources with the analog input signal to offset said analog input signal to maintain the output signal from said amplifier within said input voltage range.

3. The apparatus of claim 1 wherein the magnitude of the change in the D.C. level between successive steps is equal to the maximum permissible magnitude of the input signal to the converter.

4. The apparatus of claim 1 wherein said means responsive to the output signal from said amplifier comprises:

a plurality of D.C. current sources, differing in magnitude from each other in a binary progression;

voltage responsive means connected to said output terminal of said amplifier for producing an output signal whenever the magnitude of the output signal from said amplifier exceeds a predetermined value; and means responsive to the output signals from said voltage responsive means for selectively connecting said current sources to the input of said amplifier so as to add the signals from said current sources to the analog input signal to maintain the output of the said amplifier within said input voltage range.

5. The apparatus of claim 3 wherein said means responsive to the output signals from said voltage responsive means comprises:

a binary counter for counting the output signals from said voltage responsive means;

a plurality of normally open switches, each of said switches connecting one of said sources of current to the input of said amplifier in response to a predetermined output signal from the corresponding stage of said binary counter, whereby the count in said binary counter is a binary indication of the D.C. level; and wherein said system includes means for connecting the binary digit outputs of said counter to said recording means.

6. The apparatus of claim 4 wherein the magnitude of the one of said current sources corresponding to the least significant value of said binary progression is sufficient to cause a change in the D.C. level of the output signal from said amplifier equal to the magnitude of the maximum permissible voltage input signal of said converter.

7. An analog to digital conversion system comprising:

(a) an analog to binary digital converter;

(b) means for generating an inhibit signal when said converter is engaged in sampling and digitizing;

(c) an operational amplifier having a fixed gain said amplifier having an output terminal for connection to the input of said converter and an input terminal for connection to a source of analog input signals;

(d) comparator means continuously responsive to the output signal from said amplifier for producing a distinctive output signal whenever the magnitude of the output signal from said amplifier exceeds a predetermined value which is within the dynamic range of said converter;

(e) a binary counter;

control circuit means for causing the count in said counter to change by one count in response to an output signal from said comparator means;

(f) means responsive to said inhibit signal for preventing the count in said counter to be changed by said circuit means during the time that said converter is engaged in a sampling and digitizing operation;

(g) a plurality of D.C. current sources, differing in magnitude from each other in a binary progression;

(h) switch means responsive to the output signals from said binary counter representing the count therein for selectively connecting said current sources to the input of said operational amplifier in a manner to reduce the magnitude of the output signal from said amplifier to a level below said predetermined value; and (i) means for recording the digital output of said binary counter in synchronism with the digital output of said analog to digital converter to form a single digital word whereby the output from said binary counter comprises the most significant digits of said digitized word.

8. The system of claim 7 wherein said plurality of current sources comprises a source of D.C. reference potential and a plurality of binary weighted resistances connected in a summing network; and wherein said switch means comprises a like plurality of normally open switches, each of which is connected between a separate one of said resistances and said source of reference potential, each of said switches being responsive to an output signal from the particular output stage of said binary counter corresponding to the binary value of its respective resistance to connect said source of reference potential to the input of said amplifier via said respective resistance.

9. The system of claim 7 wherein said comparator means is responsive to the magnitude of the output signal from said amplifier exceeding said predetermined value regardless of the polarity of the signal and includes means for causing said distinctive output signal from said comparator to be indicative of the polarity; and wherein said control circuit means includes means for causing the binary counter to increase its count in response to an output signal from said comparator indicating one polarity, and decrease its count in response to an output signal from said comparator indicating the other polarity.

10. A system for converting an analog input signal to a digital output signal, comprising:

(a) an analog to digital converter, said converter being adapted to generate an inhibit signal related to the time when it is engaged in a digitizing and sampling operation;

(b) an operation amplifier having a fixed gain, said amplifier having an output terminal for connection to the input of said converter and an input terminal for connection to a source of continuously varying analog signals;

(c) a first comparator connected to said output terminal of said amplifier for producing an output signal whenever the ouptut signal from said amplifier is of a first polarity and exceeds a predetermined magnitude which is less than the maximum permissible input voltage for said converter;

(d) a second comparator connected to said output terminal of said amplifier for producing an output signal whenever the output signal from said amplifier is of a second polarity and exceeds said predetermined magnitude;

(e) a multistage binary counter;

(f) a second source of D.C. reference voltage having the same magnitude as said first source but of opposite polarity;

(g) a plurality of resistances equal in number to the number of stages in said binary counter, said resistances being connected in a binary weighted summing network with the common junction thereof connected to said input terminal of said amplifier;

(h) a like plurality of normally open switches, each of said switches being connected between a separate one of said resistances and said source of D.C. reference voltage, each of said switches being closed in response to an output signal from the particular stage of the binary counter corresponding to the binary value represented by its respective resistance, said resistances being adjusted such that the resistance corresponding to the least significant digit of said binary counter causes a change in the output signal from said amplifier equal to the magnitude of the maximum permissible voltage input signal to said converter;

(i) first circuit means responsive to the output signals from said first and second comparators for conditioning said counter to increase its count whenever said first comparator produces an output signal and for conditioning said counter to decrease its count whenever said second comparator produces an output signal;

(j) second circuit means responsive to an output signal from either said first or said second comparator for feeding an input signal to said binary counter to cause said counter change its count by one;

(k) means responsive to said inhibit signal for preventing said counter from changing its count during the time when said converter is sampling and digitizing an input signal thereto; and (l) means for recording the digital output signal from said analog to digital converter in synchronism with the digital output signal representing the count in said counter to form a single binary word wherein the digital output signals from said binary counter are the most significant digits of said digital word.

References Cited

UNITED STATES PATENTS

| | | | |
|---|---|---|---|
| 3,132,338 | 5/1964 | Schmid | 340—347 |
| 3,159,829 | 12/1964 | Straehl | 340—347 |
| 3,223,991 | 12/1965 | Dosch et al. | 340—347 |

MAYNARD R. WILBUR, Primary Examiner

G. R. EDWARDS, Assistant Examiner